(12) United States Patent
Chiu et al.

(10) Patent No.: US 12,100,772 B2
(45) Date of Patent: Sep. 24, 2024

(54) SOLAR CELL DESIGN THAT MINIMIZES WELD ATTRITION AND GRIDLINE SHADOWING LOSSES

(71) Applicant: The Boeing Company, Chicago, IL (US)

(72) Inventors: Philip T. Chiu, La Crescenta, CA (US); Peter Hebert, Glendale, CA (US); Uming T. Jeng, Rosemead, CA (US); Christopher M. Fetzer, Saugus, CA (US); Moran Haddad, La Canada Flintridge, CA (US); Dennis G. Hom, Porter Ranch, CA (US); Joseph P. O'Day, El Segundo, CA (US)

(73) Assignee: THE BOEING COMPANY, Arlington, VA (US)

( * ) Notice: Subject to any disclaimer, the term of this patent is extended or adjusted under 35 U.S.C. 154(b) by 486 days.

(21) Appl. No.: 16/431,458

(22) Filed: Jun. 4, 2019

(65) Prior Publication Data
US 2020/0388715 A1    Dec. 10, 2020

(51) Int. Cl.
*H01L 31/0224* (2006.01)
*H01L 31/18* (2006.01)

(52) U.S. Cl.
CPC ...... *H01L 31/022433* (2013.01); *H01L 31/18* (2013.01)

(58) Field of Classification Search
CPC ....... H01L 31/022441; H01L 31/02245; H01L 31/0725; H01L 31/0687; H01L 31/076;
(Continued)

(56) References Cited

U.S. PATENT DOCUMENTS

2006/0076049 A1    4/2006   Cotal et al.
2007/0095387 A1    5/2007   Fujii et al.
(Continued)

FOREIGN PATENT DOCUMENTS

JP    2017509168 A    3/2017
KR    101486206 B1    1/2015

OTHER PUBLICATIONS

Chu, "Weldability of GaAs Solar Cells on Either GaAs or Ge Substrates". Applied Solar Energy Corporation, City of Industry, California, 1988, pp. 968-973.
(Continued)

*Primary Examiner* — Bethany L Martin
(74) *Attorney, Agent, or Firm* — GATES & COOPER LLP

(57) ABSTRACT

A solar cell design includes fabricating one or more gridlines for extracting photo-current on a front surface of the solar cell, wherein each of the gridlines is a metal grid and a cap layer, and at least a portion of the metal grid is deposited on the cap layer; and controlling an alignment of the metal grid relative to the cap layer, and a width of the cap layer relative to a width of the metal grid, so that a minimum cap edge offset distance value is about 1 µm or more. The alignment of the metal grid relative to the cap layer and the width of the cap layer relative to the width of the metal grid are controlled at areas on the front surface of the solar cell opposite where welding occurs on a back-side of the solar cell. The alignments and widths of the metal grid relative to the cap layer are controlled by a photomask.

22 Claims, 8 Drawing Sheets

(58) Field of Classification Search
CPC ....... H01L 31/022433; H01L 31/02243; H01L 31/02; Y02E 10/50; Y02E 10/544
See application file for complete search history.

(56) References Cited

U.S. PATENT DOCUMENTS

| | | | |
|---|---|---|---|
| 2011/0277835 A1* | 11/2011 | Masson ........... | H01L 31/022433 |
| | | | 136/256 |
| 2012/0247554 A1* | 10/2012 | Wootton ............. | H01L 31/0508 |
| | | | 136/256 |
| 2013/0105930 A1* | 5/2013 | Zhang ................... | H01L 31/184 |
| | | | 257/437 |
| 2014/0196779 A1 | 7/2014 | Fidaner et al. | |

OTHER PUBLICATIONS

European Examination Report dated Jul. 11, 2022 for European Patent Application No. 20177750.5.
Indian Office Action dated Jan. 9, 2024 for Indian Application No. 202014023361.
Extended European Search Report dated Oct. 26, 2020 for European Patent Application No. 20177750.5.
Notice of Reasons for Rejection dated Feb. 27, 2024 for Japanese Application No. 2020-097387.

* cited by examiner

SOLAR CELL DESIGN THAT MINIMIZES WELD ATTRITION AND GRIDLINE SHADOWING LOSSES

BACKGROUND

1. Field

This disclosure is related generally to a solar cell design that minimizes weld attrition and gridline shadowing losses.

2. Background

A welding process is used to connect space solar cells in series. Traditional space solar cells are connected in series with an interconnect welded to the front of one cell and the back side of an adjacent cell. The welding process on the backside of the cell in particular requires high localized pressures and temperatures.

However, the high localized pressures and temperatures from the welding process can crack the solar cell, leading to high rejection rates for the solar cells. Front side features on the solar cells, such as metal gridlines, create stress concentration points which lead to an increase in the rate of crack generation for the solar cell during the welding process.

Stress concentration factors occur at any change in geometry of the solar cell. For example, gridlines are comprised of at least two layers including a metal grid and a semiconductor cap layer. A stress concentration factor exists for each layer.

Designing the edges of the cap layer and metal grid in close proximity maximizes cell efficiency, but also multiplies the two stress concentration factors, increasing the likelihood of cracks. Gridlines must be distributed uniformly across the front surface to extract power efficiently, so there is no practical way to avoid backside welding at the same location as front-side gridlines.

Changes to the welding process parameters have been used to mitigate attrition in the past. The parameters include modifying fixture temperatures, weld force, weld pulse shapes, counts or duration, or changing the shape or size of weld tips.

Nonetheless, there is a need for improved solar cell designs that mitigate attrition in the welding process.

SUMMARY

To overcome the limitations described above, and to overcome other limitations that will become apparent upon reading and understanding the present specification, this disclosure describes a method of fabricating a device, and the device as fabricated, wherein the device comprises a solar cell design that minimizes weld attrition and gridline shadowing losses.

The method comprises: fabricating one or more gridlines for extracting photo-current on a front surface of a solar cell, wherein each of the gridlines is a metal grid and a cap layer, and at least a portion of the metal grid is deposited on the cap layer; and controlling an alignment of the metal grid relative to the cap layer and a width of the cap layer relative to a width of the metal grid so that a minimum cap edge offset distance value is about 1 μm or more.

Controlling the alignment of the metal grid relative to the cap layer and the width of the cap layer relative to the width of the metal grid results in cap edge offset L and cap edge offset R values representing distances of edges of the cap layer from edges of the metal grid on a left and right side of the cap layer, respectively, and the minimum cap edge offset distance value is a minimum value between the cap edge offset L and cap edge offset R values. The minimum cap edge offset distance value is about 5% to 25% of the width of the metal grid.

The alignment of the metal grid relative to the cap layer, and the width of the cap layer relative to the width of the metal grid, are controlled at areas on the front surface of the solar cell opposite where welding occurs on a back-side of the solar cell. The alignment of the metal grid relative to the cap layer, and the width of the cap layer relative to the width of the metal grid, are controlled by a photomask.

An edge of the metal grid and an edge of the cap layer are separated far enough apart that stress concentration factors do not interact, in order to reduce cracks on a back-side of the solar cell that result from welding, without impacting the solar cell's efficiency. Preferably, the edge of the metal grid and the edge of the cap layer are separated by a distance of at least 1 μm.

The device as fabricated comprises: a solar cell including one or more gridlines for extracting photo-current on a front surface of the solar cell, wherein: each of the gridlines is a metal grid and a cap layer, and at least a portion of the metal grid is deposited on the cap layer; and an alignment of the metal grid relative to the cap layer and a width of the cap layer relative to a width of the metal grid are controlled so that a minimum cap edge offset distance value is about 1 μm or more.

DRAWINGS

Referring now to the drawings in which like reference numbers represent corresponding parts throughout:

DETAILED DESCRIPTION

In the following description, reference is made to the accompanying drawings which form a part hereof, and in which is shown by way of illustration a specific example in which the disclosure may be practiced. It is to be understood that other examples may be utilized and structural changes may be made without departing from the scope of the present disclosure.

OVERVIEW

Traditional space solar cells are connected in series with an interconnect welded to the front of one cell and the back side of an adjacent cell. The welding process on the backside of the cell in particular requires high localized pressures and temperatures that can lead to cracks in the solar cells, leading to, in one example, attrition levels exceeding 20% at a potential cost of 1-4 million dollars, depending on production volumes.

A root cause and corrective action (RCCA) investigation found that subtle changes in the gridlines configuration on the front surface of the solar cell can greatly increase the rate of cracks due to welding on the back-side of the solar cell. This disclosure modifies the design of the gridlines to reduce cracks from back-side welding without significant tradeoffs to the solar cell efficiency. Specifically, this disclosure ensures that metal grid and cap layer edges are separated far enough apart that the stress concentration factors do not interact, reducing cracks from back-side welding without impacting the solar cell efficiency. From a mask design perspective, sharp alignment of the cap layer and metal grid has also been mitigated by designing the cap layer wider than the metal grid in what is known as a "cap greater than metal" (CGM) alignment.

TECHNICAL DISCLOSURE

Figure 1:
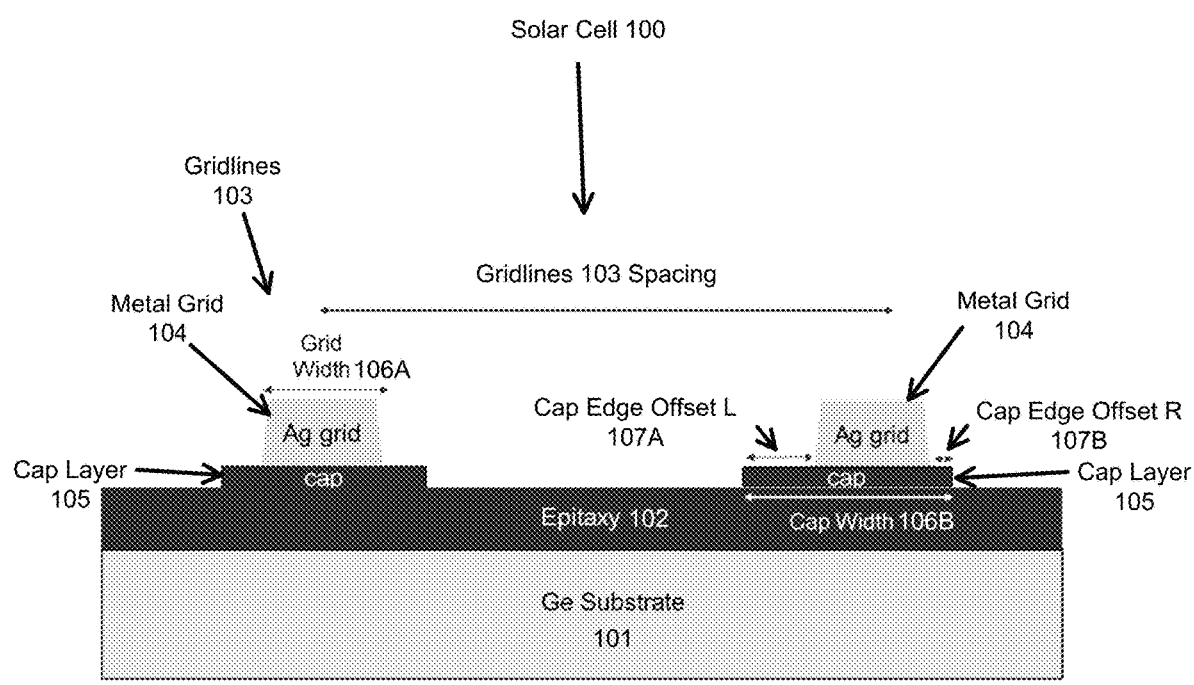
FIG. 1 is a schematic of a solar cell showing a cross-section thereof, according to one example of this disclosure.
Figure 2:
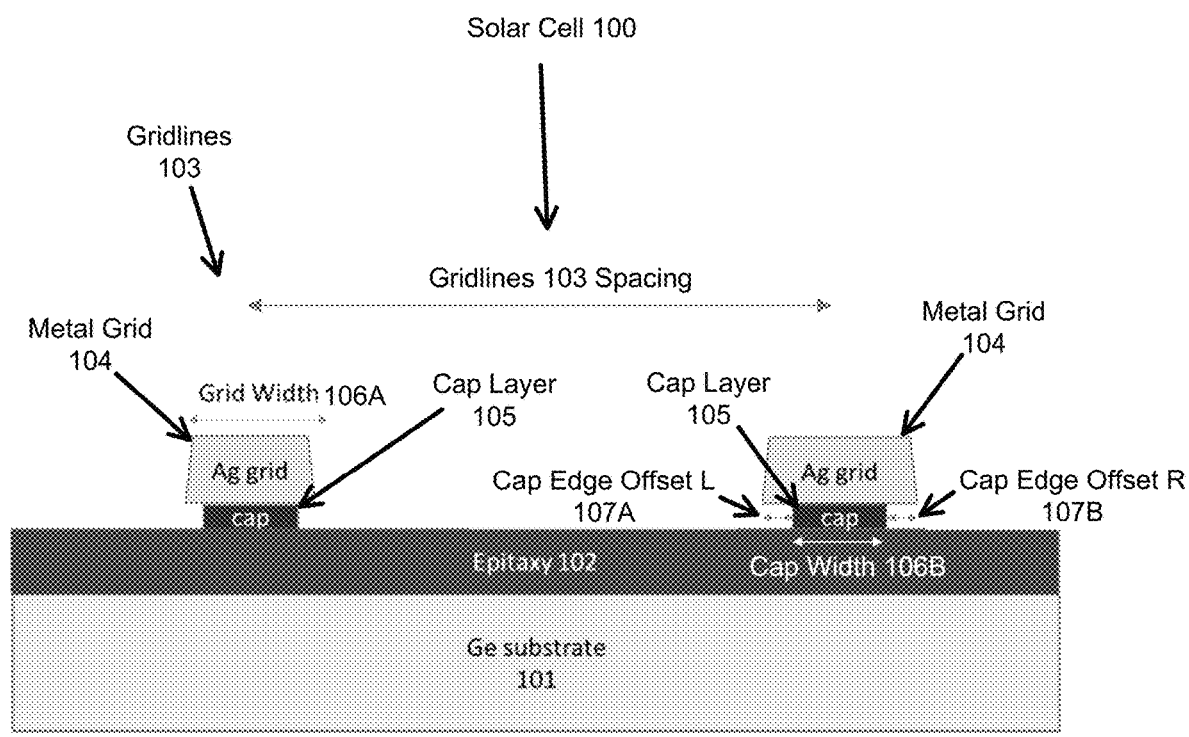
FIG. 2 is a schematic of a solar cell showing a cross-section thereof, according to one example of this disclosure.

FIGS. 1 and 2 are schematics of devices, wherein both devices comprise a solar cell 100, showing a cross-section thereof, including a profile view of the solar cell 100, and describing a method of fabricating the devices.

The solar cell 100 is comprised of a germanium (Ge) substrate 101 and semiconductor epitaxy 102, with one or more periodic gridlines 103 on a front surface of the solar cell 100. Each of the gridlines 103 is a metal grid 104 comprised of silver (Ag) and an absorptive cap layer 105 comprised of gallium arsenide (GaAs), wherein at least a portion of the metal grid 104 is deposited on the cap layer 105.

The gridlines 103 extract photo-current out of the front surface of the solar cell 100. The cap layer 105 is needed to make ohmic contact between the metal grid 104 and the semiconductor epitaxy 102. The metal grid 104 carries the current to an ohmic pad for power extraction off the solar cell 100.

FIG. 1 illustrates an example where the width 106A of the metal grid 104 is narrower than the width 106b of the cap layer 105, while FIG. 2 illustrates an example where the width 106A of the metal grid 104 is wider than the width 106B of the cap layer 105.

Depending on the alignment of the metal grid 104 to the cap layer 105, and the relative widths 106A, 106B of the metal grid 104 and cap layer 105, there are Cap Edge Offset L and Cap Edge Offset R values 107A, 107B representing distances of edges of the cap layer 105 from edges of the metal grid 104 on a left and right side of the cap layer 105, respectively. A Minimum Cap Edge Offset Distance value is a minimum value between the Cap Edge Offset L and Cap Edge Offset R values 107A, 107B. Depending on the relative alignment and/or the relative widths 106A, 106B, the Minimum Cap Edge Offset Distance value can approach 0 or even be negative.

Over the course of the RCCA investigation, it was determined that back-side weld attrition has a dramatic dependence on the Minimum Cap Edge Offset Distance value. Specifically, there is a rapid onset of transition into attrition starting at a Minimum Cap Edge Offset Distance value of less than 1 μm.

For Minimum Cap Edge Offset Distance values over 1 μm, the backside weld attrition is near 0. For Minimum Cap Edge Offset Distance values <1 μm, there is an increase in attrition to 15-20% losses per weld. As all solar cells 100 in the factory have at least two welds, total losses can approach 50% in the factory from a single process step.

An analysis was performed to better understand the mechanism behind the clear dependence between weld attrition and the Minimum Cap Edge Offset Distance values. The analysis confirms that stress associated with the weld is concentrated at the edge of the cap layer 105 to the epitaxy layers 102. That stress is enhanced by nearly a factor of 2 when the edge of the metal grid 104 is aligned to the edge of the cap layer 105, or when the Minimum Cap Edge Offset Distance value approaches 0.

This disclosure reduces the gridline stress concentration that leads to the large weld attrition numbers. In the solar cell 100 fabrication process, the width 106B of the cap layer 105 relative to the width 106A of the metal grid 104 can be independently controlled at any spatial location on the solar cell 100 via the design of independent photomasks for the metal grid 104 and cap layer 105.

Typically, a choice is made to engineer the width 106B of the cap layer 105 to be equal the width 106A of the metal grid 104 to minimize unwanted shadowing of the solar cell 100. Both the metal grid 104 and cap layer 105 are absorptive and prevent current generation where they exist on the front surface of the solar cell 100.

Unfortunately, if the width 106B of the cap layer 105 and the width 106A of the metal grid 104 are equal, this, by definition, would result in a Minimum Cap Edge Offset Distance value of near 0, resulting in unacceptable levels of attrition. Engineering the width 106B of the cap layer 105 relative to the width 106A of the metal grid 104 to result in a large Minimum Cap Edge Offset Distance value would solve the attrition issue, but lead to unacceptable levels of shadowing loss and solar cell 100 performance.

Figures 3A, 3B, 3C:
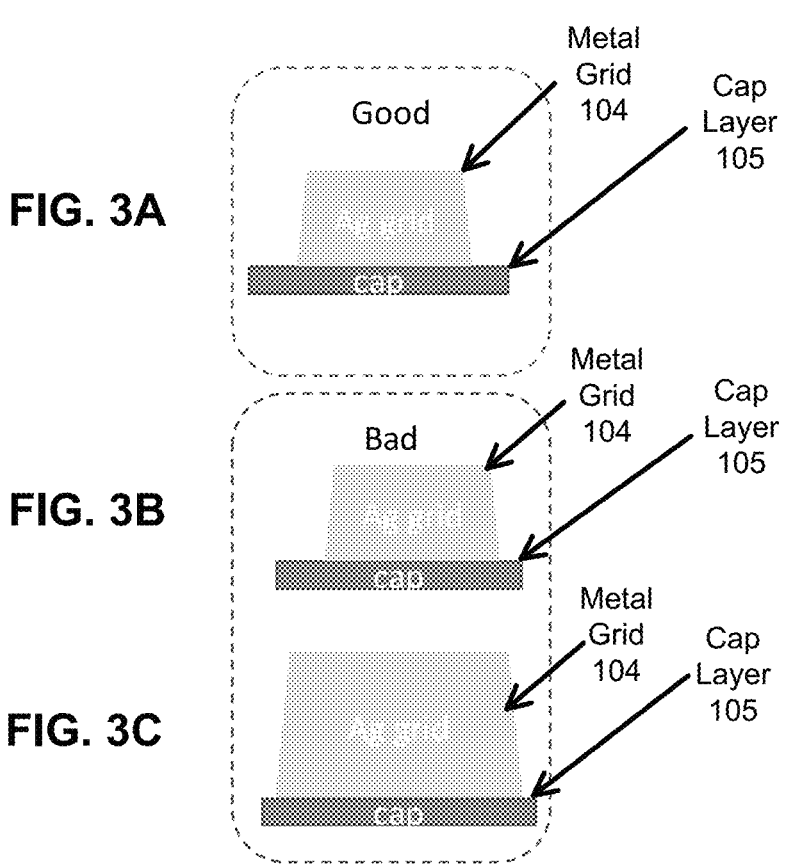
FIGS. 3A, 3B, 3C, 3D, 3E and 3F are schematics of a metal grid and cap layer corresponding to FIGS. 1 and 2, each showing a cross-section thereof, according to one example of this disclosure.

FIGS. 3A, 3B and 3C are schematics of the metal grid 104 and cap layer 105 corresponding to FIG. 1, each showing a cross-section thereof, where the width 106A of the metal grid 104 is narrower than the width 106b of the cap layer 105, and indicating that the alignment of FIG. 3A provides good results, while the alignments of FIGS. 3B and 3C provide bad results.

Figure 3D:
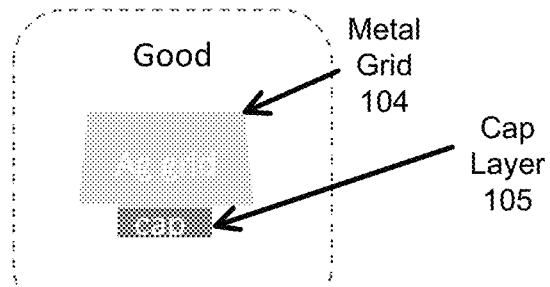
Figure 3E:
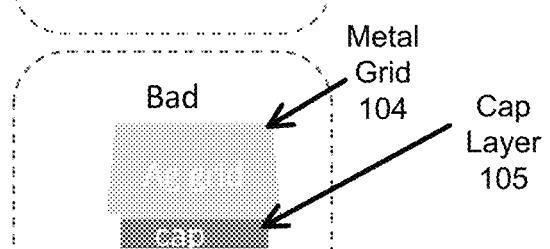
Figure 3F:
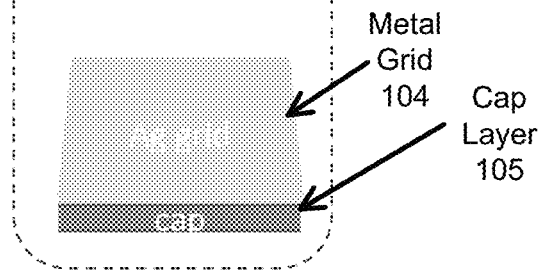

Similarly, FIGS. 3D, 3E and 3F are schematics of the metal grid 104 and cap layer 105 corresponding to FIG. 2, each showing a cross-section thereof, where the width 106A of the metal grid 104 is wider than the width 106b of the cap layer 105, and indicating that the alignment of FIG. 3D provides good results, while the alignments of FIGS. 3E and 3F provide bad results.

Figure 4:
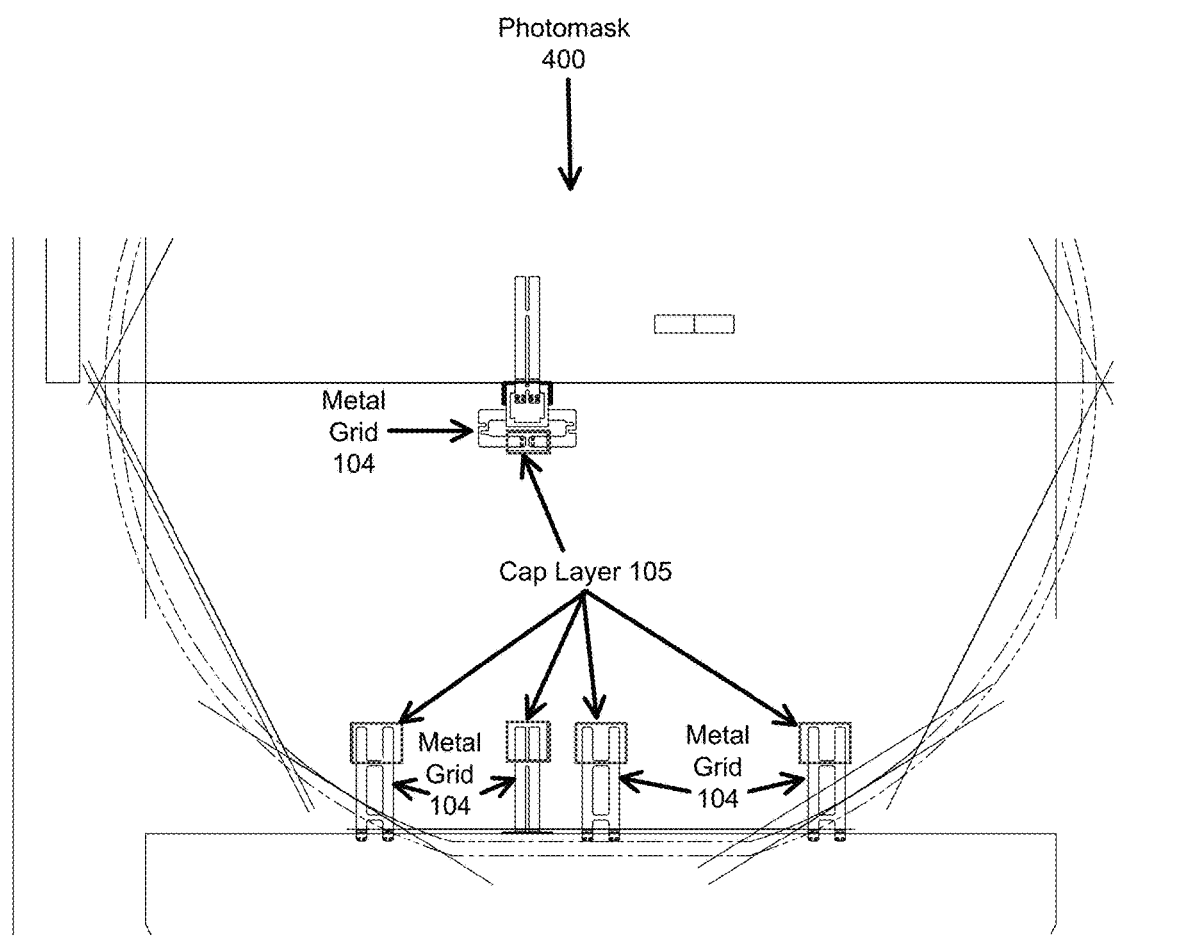
FIG. 4 is a schematic of a photomask of solar cells indicating the areas altered to minimize weld attrition.

FIG. 4 is a schematic of a photomask 400 of a back-side of a solar cell 100 indicating areas of modification to the grids 104 and cap layers 105 on the front-side of the solar cell 100 to minimize weld attrition. Specifically, the cap layers 105 are about 10 μm wider than the metal grids 104 only in areas opposite where the welding occurs on the back-side of the solar cell 100. In this way, attrition is minimized as the areas where the weld occurs has Minimum Cap Edge Offset Distance values of about 5 μm in a perfect alignment case.

This provides a margin in the case where the widths 106B of the cap layers 105, the widths 106A of the metal grids 104, and the alignment, varies over the course of production. Moreover, the impact on the efficiency is minimal as the increase in the widths 106B of the cap layers 105 occurs only a small fractional area of the solar cell 100. Calculations put the impact on the solar cell 100 current on a 0.01% level.

In an alternative photomask 400, the cap layers 105 are about 10 μm narrower than the metal grids 104 only in areas opposite where the welding occurs on the back-side of the solar cell 100. Again, attrition is minimized as the areas where the weld occurs has Minimum Cap Edge Offset Distance values of about 5 μm in a perfect alignment case.

Process Steps

Figure 5:
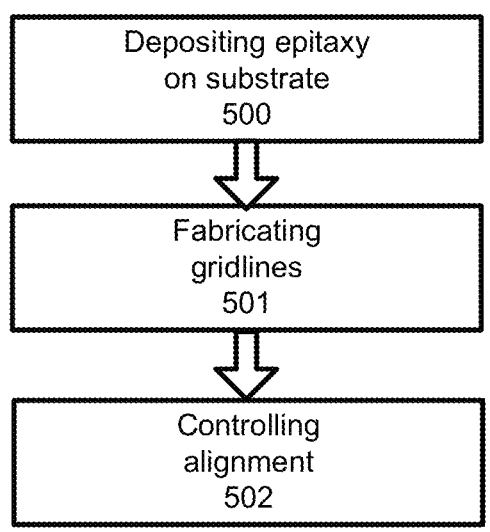
FIG. 5 is a flowchart illustrating a method for fabricating a solar cell, according to one example.

FIG. 5 is a flowchart illustrating a method for fabricating the solar cell 100, according to one example.

Block 500 represents the step of depositing the semiconductor epitaxy 102 on the Ge substrate 101, thereby forming the solar cell 100.

Block 501 represents the step of fabricating one or more gridlines 103 for extracting photo-current on a front surface of the solar cell 100, wherein each of the gridlines 103 is a metal grid 104 and a cap layer 105, and at least a portion of the metal grid 104 is deposited on the cap layer 105.

Block 502 represents the step of controlling an alignment of the metal grid 104 relative to the cap layer 105 and a width of the cap layer 105 relative to a width of the metal grid 104 so that a Minimum Cap Edge Offset Distance value is about 1 μm or more.

Controlling the alignment of the metal grid 104 relative to the cap layer 105 and the width of the cap layer 105 relative to the width of the metal grid 104 results in Cap Edge Offset L and Cap Edge Offset R values 107A, 107B representing distances of edges of the cap layer 105 from the edges of the metal grid 104 on a left and right side of the cap layer 105, respectively, and the Minimum Cap Edge Offset Distance value is a minimum value between the Cap Edge Offset L and Cap Edge Offset R values 107A, 107B. The Minimum Cap Edge Offset Distance value preferably is about 5% to 25% of the width 106A of the metal grid 104.

The alignment of the metal grid 104 relative to the cap layer 105 and the width of the cap layer 105 relative to the width of the metal grid 104 are controlled at areas on the front surface of the solar cell 100 opposite where welding occurs on a back-side of the solar cell 100.

An edge of the metal grid 104 and an edge of the cap layer 105 are separated far enough apart that stress concentration factors do not interact, in order to reduce cracks on a back-side of the solar cell 100 that result from the welding, without impacting the solar cell's 100 efficiency. The edge of the metal grid 104 and the edge of the cap layer 105 are separated by a distance of at least 1 μm, at least 1.5 to 2 μm, or at least 3 to 100 μm or more.

The alignment of the metal grid 104 relative to the cap layer 105, and the width 106B of the cap layer 105 relative to the width 106A of the metal grid 104, are controlled by a photomask 400. The width 106B of the cap layer 105 may be less than the width 106A of the metal grid 104 or the width 106B of the cap layer 105 may be greater than the width 106A of the metal grid 104.

BENEFITS AND ADVANTAGES

Previous to this disclosure, solutions for solar cell cracks at gridlines from back-side welding were limited to changing weld conditions or to having a wider cap layer relative to the metal grid over the entire solar cell area.

Changes to the welding process can result in lower solar cell attrition. However, this typically results in welding conditions that reduce the strength of the weld joint. In the extreme thermal environments space solar cells experience in mission, loss of weld strength can result in failures of the weld joints. These failures would impact performance of the solar cell array during the mission. This disclosure requires no changes to the weld process and therefore no loss of weld reliability.

The disclosure is also superior to a solution that has the cap layer wider than the metal grid ("cap greater than metal" or CGM) over the entire solar cell area. A cap greater than metal solution leads to unnecessary reductions in solar cell current on the order of 1% relative. What is proposed here is to use the photomask design to widen the cap layer in only critical welding areas. In this way, with "cap equal to metal" (CEM) over the vast majority of the solar cell area, thereby minimizing the effects on current collection, but at the same time ensuring a Minimum Cap Edge Offset Distance value >>1 μm in the areas where the welds occur. Effectively, this disclosure provides a method to minimize both attrition and shadowing losses.

Alternatives and Modifications

The description set forth above has been presented for purposes of illustration and description, and is not intended to be exhaustive or limited to the examples described. Many alternatives and modifications may be used in place of the specific description set forth above.

For example, although this disclosure describes the use of gridlines for solar cells, it could be broadened to cover any pattern of metallization used to collect current on a surface of a solar cell.

In another example, although the metal grid is described as comprising Ag and the cap layer is described as comprising GaAs, other materials could also be used.

In yet another example, although this disclosure describes the Minimum Cap Edge Offset Distance value as about 1 μm or more, the Minimum Cap Edge Offset Distance value may be at least 1.5 to 2 μm, or 3 to 100 μm or more.

Similarly, although this disclosure describes the edge of the metal grid and the edge of the cap layer as being separated by a distance of at least 1 μm, the distance may be at least 1.5 to 2 μm, or 3 to 100 μm or more.

Aerospace Applications

Figure 6A:
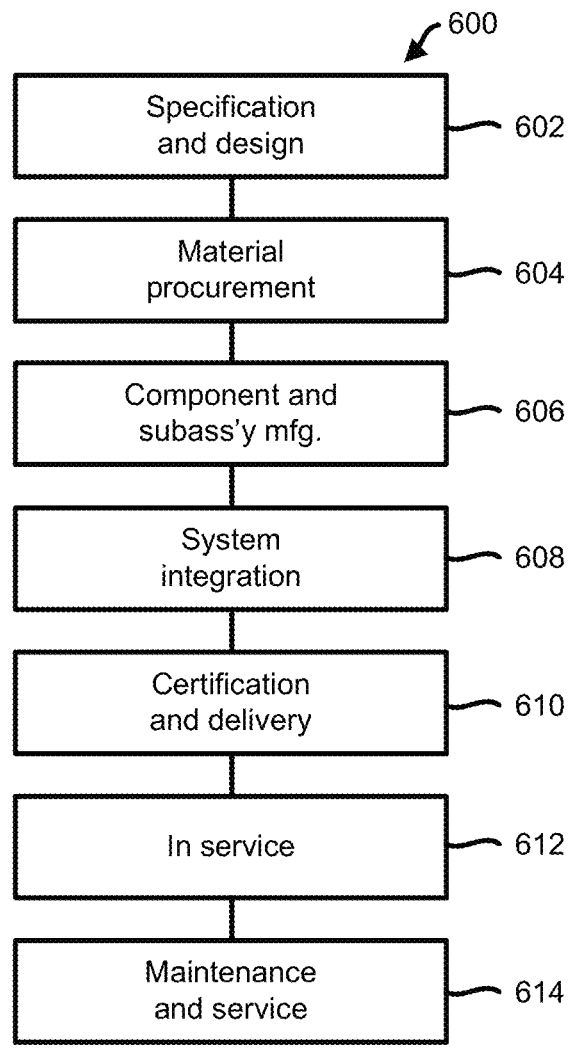
FIG. 6A illustrates a method of fabricating a solar cell, solar cell panel and/or satellite.
Figure 6B:
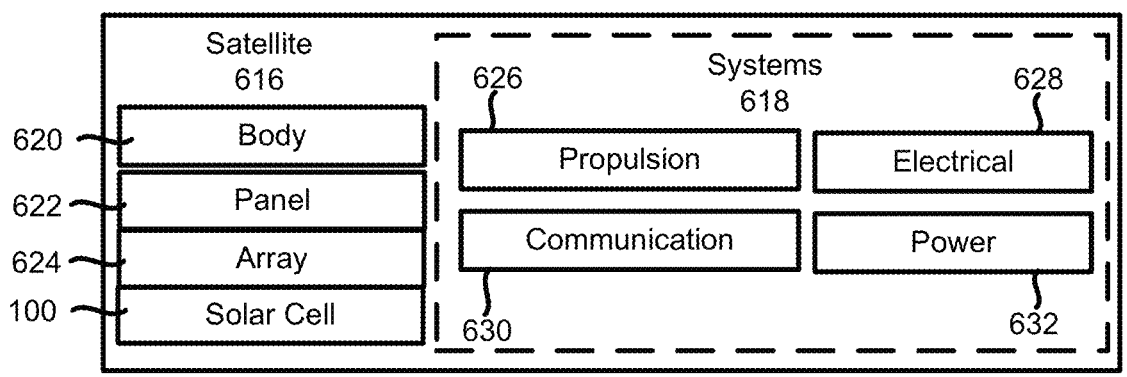
FIG. 6B illustrates a resulting satellite having a solar cell panel comprised of solar cells.

Examples of the disclosure may be described in the context of a method 600 of fabricating a solar cell, solar cell panel and/or aerospace vehicle such as a satellite, comprising steps 602-614, as shown in FIG. 6A, wherein the resulting satellite 616 comprised of various systems 618 and a body 620, including a panel 622 comprised of an array 624 of one or more solar cells 100 is shown in FIG. 6B.

As illustrated in FIG. 6A, during pre-production, exemplary method 600 may include specification and design 602 of the satellite 616, and material procurement 604 for same. During production, component and subassembly manufacturing 606 and system integration 608 of the satellite 616 takes place, which include fabricating the satellite 616, panel 622, array 624 and solar cells 100. Thereafter, the satellite 616 may go through certification and delivery 610 in order to be placed in service 612. The satellite 616 may also be scheduled for maintenance and service 614 (which includes modification, reconfiguration, refurbishment, and so on), before being launched.

Each of the processes of method 600 may be performed or carried out by a system integrator, a third party, and/or an operator (e.g., a customer). For the purposes of this description, a system integrator may include without limitation any number of manufacturers and major-system subcontractors; a third party may include without limitation any number of venders, subcontractors, and suppliers; and an operator may be a satellite company, military entity, service organization, and so on.

As shown in FIG. 6B, the satellite 616 fabricated by exemplary method 600 may include various systems 618 and a body 620. Examples of the systems 618 included with the satellite 616 include, but are not limited to, one or more of a propulsion system 626, an electrical system 628, a communications system 630, and a power system 632. Any number of other systems also may be included.

Functional Block Diagram

Figure 7:
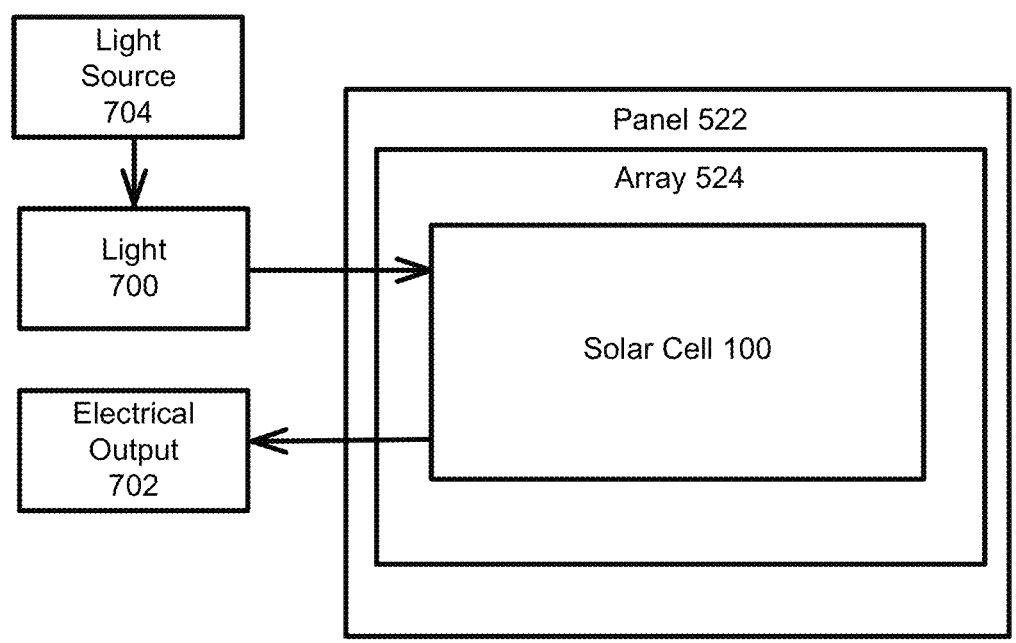
FIG. 7 is an illustration of the solar cell panel in the form of a functional block diagram.

FIG. 7 is an illustration of the panel 622 in the form of a functional block diagram, according to one example. The panel 622 is comprised of the array 624, which is comprised of one or more of the solar cells 100 individually attached to the panel 622. Each of the solar cells 100 absorbs light 700 from a light source 702 and generates an electrical output 704 in response thereto.

At least one of the solar cells 100 includes one or more gridlines 103 for extracting photo-current on a front surface of the solar cell 100, wherein each of the gridlines 103 is a metal grid 104 and a cap layer 105, and at least a portion of the metal grid 104 is deposited on the cap layer 105. An alignment of the metal grid 104 relative to the cap layer 105 and a width of the cap layer 105 relative to a width of the metal grid 104 are controlled so that a Minimum Cap Edge Offset Distance value is about 1 µm or more.

The alignment of the metal grid 104 relative to the cap layer 105 and the width of the cap layer 105 relative to the width of the metal grid 104 result in Cap Edge Offset L and Cap Edge Offset R values 107A, 107B representing distances of edges of the cap layer 105 from edges of the metal grid 104 on a left and right side of the cap layer 105, respectively, and the Minimum Cap Edge Offset Distance value is a minimum value between the Cap Edge Offset L and Cap Edge Offset R values 107A, 107B. The Minimum Cap Edge Offset Distance value preferably is about 5% to 25% of the width 106A of the metal grid 104.

The alignment of the metal grid 104 relative to the cap layer 105 and the width of the cap layer 105 relative to the width of the metal grid 104 are controlled at areas on the front surface of the solar cell 100 opposite where welding occurs on a back-side of the solar cell 100.

An edge of the metal grid 104 and an edge of the cap layer 105 are separated far enough apart that stress concentration factors do not interact, in order to reduce cracks on a back-side of the solar cell 100 that result from the welding, without impacting the solar cell's 100 efficiency. The edge of the metal grid 104 and the edge of the cap layer 105 are separated by a distance of at least 1 µm, at least 1.5 to 2 µm, or at least 3 to 100 µm or more.

The alignment of the metal grid 104 relative to the cap layer 105, and the width 106A of the metal grid 104 relative to the width 106B of the cap layer 105, are controlled by a photomask 400. The width 106B of the cap layer 105 may be less than the width 106A of the metal grid 104 or the width 106B of the cap layer 105 may be greater than the width 106A of the metal grid 104.

What is claimed is:

1. A method, comprising:
    fabricating one or more gridlines for extracting photo-current on a front surface of a solar cell, wherein each of the gridlines is a metal grid and a cap layer, and at least a portion of the metal grid is deposited on the cap layer; and
    minimizing weld attrition by controlling an alignment of the metal grid relative to the cap layer and a width of the cap layer relative to a width of the metal grid so that a minimum cap edge offset distance value is about 1 µm or more.

2. The method of claim 1, wherein controlling the alignment of the metal grid relative to the cap layer and the width of the cap layer relative to the width of the metal grid results in cap edge offset L and cap edge offset R values representing distances of edges of the cap layer from edges of the metal grid on a left and right side of the cap layer, respectively, and the minimum cap edge offset distance value is a minimum value between the cap edge offset L and cap edge offset R values.

3. The method of claim 2, wherein the minimum cap edge offset distance value is about 5% to 25% of the width of the metal grid.

4. The method of claim 1, wherein the alignment of the metal grid relative to the cap layer and the width of the cap layer relative to the width of the metal grid are controlled at areas on the front surface of the solar cell opposite where welding occurs on a back-side of the solar cell.

5. The method of claim 4, wherein an edge of the metal grid and an edge of the cap layer are separated far enough apart that stress concentration factors do not interact, in order to reduce cracks on the solar cell that result from the welding on the back-side of the solar cell, without impacting the solar cell's efficiency.

6. The method of claim 5, wherein the edge of the metal grid and the edge of the cap layer are separated by a distance of at least 1 µm.

7. The method of claim 6, wherein the edge of the metal grid and the edge of the cap layer are separated by a distance of at least 1.5 to 2 µm.

8. The method of claim 7, wherein the edge of the metal grid and the edge of the cap layer are separated by a distance of at least 3 to 100 µm or more.

9. The method of claim 1, wherein the alignment of the metal grid relative to the cap layer is controlled by a photomask.

10. The method of claim 9, wherein the width of the cap layer relative to the width of the metal grid is controlled by the photomask.

11. The method of claim 1, wherein the width of the cap layer is less than the width of the metal grid or the width of the cap layer is greater than the width of the metal grid.

12. A device, comprising:
    a solar cell including one or more gridlines for extracting photo-current on a front surface of the solar cell, wherein:
    each of the gridlines is a metal grid and a cap layer, and at least a portion of the metal grid is deposited on the cap layer; and
    weld attrition is minimized by controlling an alignment of the metal grid relative to the cap layer and a width of the cap layer relative to a width of the metal grid so that a minimum cap edge offset distance value is about 1 µm or more.

13. The device of claim 12, wherein controlling the alignment of the metal grid relative to the cap layer and the width of the cap layer relative to the width of the metal grid results in cap edge offset L and cap edge offset R values representing distances of edges of the cap layer from edges of the metal grid on a left and right side of the cap layer, respectively, and the minimum cap edge offset distance value is a minimum value between the cap edge offset L and cap edge offset R values.

14. The device of claim 13, wherein the minimum cap edge offset distance value is about 5% to 25% of the width of the metal grid.

15. The device of claim 12, wherein the alignment of the metal grid relative to the cap layer and the width of the cap layer relative to the width of the metal grid are controlled at areas on the front surface of the solar cell opposite where welding occurs on a back-side of the solar cell.

16. The device of claim 15, wherein an edge of the metal grid and an edge of the cap layer are separated far enough apart that stress concentration factors do not interact, in order to reduce cracks on the solar cell that result from the welding on the back-side of the solar cell, without impacting the solar cell's efficiency.

17. The device of claim 16, wherein the edge of the metal grid and the edge of the cap layer are separated by a distance of at least 1 μm.

18. The device of claim 17, wherein the edge of the metal grid and the edge of the cap layer are separated by a distance of at least 1.5 to 2 μm.

19. The device of claim 18, wherein the edge of the metal grid and the edge of the cap layer are separated by a distance of at least 3 to 100 μm or more.

20. The device of claim 12, wherein the width of the cap layer is less than the width of the metal grid or the width of the cap layer is greater than the width of the metal grid.

21. The method of claim 1, wherein minimizing weld attrition further comprises minimizing both weld attrition and gridline shadowing losses by controlling the alignment of the metal grid relative to the cap layer and the width of the cap layer relative to the width of the metal grid so that the minimum cap edge offset distance value is about 1 μm or more.

22. The device of claim 12, wherein the weld attrition is minimized further comprises both the weld attrition and gridline shadowing losses are minimized by controlling the alignment of the metal grid relative to the cap layer and the width of the cap layer relative to the width of the metal grid so that the minimum cap edge offset distance value is about 1 μm or more.

* * * * *